US011216893B2

(12) United States Patent
Alakontiola et al.

(10) Patent No.: US 11,216,893 B2
(45) Date of Patent: Jan. 4, 2022

(54) POWER FLOW CHARACTERISTICS (71) Applicant: Reactive Technologies Limited, Oxford (GB)

(72) Inventors: Jukka Alakontiola, Oulu (FI); Abhishek Jain, London (GB); Timo Peltola, Lohja (FI); Marc Borrett, Poole (GB); Mika Ventola, Oulu (FI)

(73) Assignee: Reactive Technologies Limited, Oxford (GB)

( * ) Notice: Subject to any disclaimer, the term of this patent is extended or adjusted under 35 U.S.C. 154(b) by 129 days.

(21) Appl. No.: 16/425,438

(22) Filed: May 29, 2019

(65) Prior Publication Data

US 2019/0279314 A1    Sep. 12, 2019

Related U.S. Application Data (63) Continuation of application No. PCT/EP2017/080709, filed on Nov. 28, 2017.

(30) Foreign Application Priority Data

Nov. 30, 2016  (GB) ..................... 1620329

(51) Int. Cl.
*G06Q 50/06*    (2012.01)
*G08C 17/02*    (2006.01)
(Continued)

(52) U.S. Cl.
CPC ......... *G06Q 50/06* (2013.01); *G01R 19/2513* (2013.01); *G08C 17/02* (2013.01);
(Continued)

(58) Field of Classification Search
CPC .... G06Q 50/06; G08C 17/02; G01R 19/2513; Y02P 80/10; Y04S 10/50; Y02E 10/56;
(Continued)

(56) References Cited

U.S. PATENT DOCUMENTS 8,688,282 B2    4/2014  Garcia
9,122,274 B2    9/2015  Nielsen
(Continued)

FOREIGN PATENT DOCUMENTS

GB    2510735 A    8/2014
GB    2515358 A    12/2014

OTHER PUBLICATIONS

Ulbig et al., "Predictive Control for Real-Time Frequency Regulation and Rotational Inertia Provision in Power Systems", 52nd IEEE Conference on Decision and Control, Dec. 10-13, 2013, Florence, Italy, pp. 2946 to 2953, XP032576263, ISSN: 0743-1546, DOI:10.1109/CDC.2013.6760331, ISBN: 978-1-4673-5714-2.

(Continued)

*Primary Examiner* — Mohammad Ali
*Assistant Examiner* — Sheela Rao
(74) *Attorney, Agent, or Firm* — EIP US LLP (57) ABSTRACT Methods, computer software and apparatus for use in an electric power grid are described. Measurement data is received intermittently or continuously from a plurality of measurement units, indicating values of at least one measured characteristic at respective measurement locations. The at least one is characteristic is monitored, and it is determined, based on the monitoring, that there has been a change in electric power flow in the electric power grid. Responsive to the determination, component data is accessed relating to characteristics of components of the electric power grid involved in provision and/or consumption of electric power. Based on received measurement data (Continued)

relating to the change and the accessed component data, a power flow characteristic of the grid in a given time period is determined.

14 Claims, 9 Drawing Sheets

(51) Int. Cl.
*G01R 19/25* (2006.01)
*H02J 3/38* (2006.01)
*H02J 3/24* (2006.01)
*H02J 3/00* (2006.01)

(52) U.S. Cl.
CPC ............... *H02J 3/24* (2013.01); *H02J 3/38* (2013.01); *H02J 3/383* (2013.01); *H02J 3/003* (2020.01); *H02J 3/386* (2013.01); *Y02P 80/10* (2015.11)

(58) Field of Classification Search
CPC . Y02E 10/76; H02J 3/241; H02J 3/382; H02J 13/0006; H02J 3/24; H02J 3/383; H02J 3/003; H02J 3/386
See application file for complete search history.

(56) References Cited

U.S. PATENT DOCUMENTS

| | | | |
|---|---|---|---|
| 9,341,162 B2 | 5/2016 | Garcia | |
| 9,562,925 B2 | 2/2017 | Nulty | |
| 10,019,024 B2 | 7/2018 | Chan | |
| 2005/0033481 A1* | 2/2005 | Budhraja | ................ H02J 3/008 700/286 |
| 2016/0248254 A1* | 8/2016 | Huomo | ............... H02J 13/0006 |
| 2019/0348839 A1 | 11/2019 | Oakes | |

OTHER PUBLICATIONS

United Kingdom Combined Search and Examination Report dated May 18, 2017 for Application No. GB1620329.1.
International Search Report and Written Opinion dated Apr. 5, 2018 for PCT Application No. PCT/EP2017/080702.
International Search Report and Written Opinion dated Apr. 6, 2018 for PCT Application No. PCT/EP2017/080709.
United States Notice of Allowance dated Feb. 17, 2021 for U.S. Appl. No. 16/425,419.

\* cited by examiner

| 402 Component ID | 404 Type | 406 Location | 408 Operating Characteristics |
|---|---|---|---|
| ID1 | Provider | Location#1 | O#1 |
| ID2 | Consumer | Location#2 | O#2 |
| ID3 | Interconnector | Location#3 | O#3 |
| ... | ... | ... | ... |

| 452 Unit ID | 454 Measurement Location |
|---|---|
| ID1a | Location#1a |
| ID2a | Location#2a |
| ID3a | Location#3a |
| ... | ... |

POWER FLOW CHARACTERISTICS

CROSS-REFERENCE TO RELATED APPLICATIONS

This application is a continuation of International Application No. PCT/EP2017/080709, filed Nov. 28, 2017, which claims priority to UK Application No. GB1620329.1, filed Nov. 30, 2016, under 35 U.S.C. § 119(a). Each of the above-referenced patent applications is incorporated by reference in its entirety.

BACKGROUND OF THE INVENTION

Field of the Invention

The present invention relates to methods, systems and computer software for determining power flow characteristics of an electric power grid.

Description of the Related Technology

The exchange of electrical power between providers and consumers takes place via an electric power grid. In such an electric power grid, electrical power may be supplied by a combination of relatively large capacity power stations and relatively small capacity renewable energy sources, for example. Electric power may also be shared between electric power grids, via interconnects between the respective grids. Consumers of electric power include domestic households and businesses including factories and the like.

It is desirable that rate of electric power provision to the electric power grid balances with the rate of consumption of same, so as to avoid, for example, insufficient electric power being available to meet consumer requirements. Further, when imbalances occur, this can result in a detrimental effect on characteristics of the electric power flowing in the electric power grid. In such cases, it may take time to make necessary adjustments to reduce or eliminate the imbalance.

Existing methods typically involve a system operator providing forecasts of how the power balance may vary in the future, based on, for example expected changes in consumption patterns and/or expected changes in conditions such as weather conditions (which may affect performance of renewal energy providers, such as a wind power generators, for example).

However, such methods can be imprecise. They also do not take account of unexpected imbalances which may occur. Unexpected imbalances may occur due to, for example, events such as a failure of a power provider such as a power station, or of a connection from a neighbouring power grid.

A method of estimating power output of power plants using thermal imaging techniques is described in U.S. Pat. No. 8,972,273B1. However, such methods are costly to implement.

SUMMARY

According to a first aspect of the present invention, there is provided a method for use in an electric power grid, electric power flowing in the electric power grid, the method comprising:

receiving measurement data intermittently or continuously from a plurality of measurement units, the measurement units being arranged to measure at least one characteristic of the electric power at respective measurement locations in the electric power grid, the measurement data indicating values of the at least one measured characteristic at the respective measurement locations;

monitoring the at least one characteristic at the plurality of measurement locations based on the received data;

determining, based on the monitoring, that there has been a change in electric power flow in the electric power grid;

responsive to the determination, accessing component data relating to characteristics of components of the electric power grid involved in provision and/or consumption of electric power; and based on received measurement data relating to the change and the accessed component data, determining a power flow characteristic of the grid in a given time period, the power flow characteristic relating to an amount of power flow to and/or from at least one of the components.

According to a second aspect of the present invention, there is provide a monitoring system for use in an electric power grid, electric power flowing in the electric power grid, the monitoring system comprising a communications interface and a processor, wherein:

the communications interface is arranged to receive measurement data intermittently or continuously from a plurality of measurement units, the measurement units being arranged to measure at least one characteristic of the electric power at respective measurement locations in the electric power grid, the measurement data indicating values of the at least one measured characteristic at the respective measurement locations; and the processor is arranged to:

monitor the at least one characteristic at the plurality of measurement locations based on the received data;

determine, based on the monitoring, that there has been a change in electric power flow in the electric power grid;

responsive to the determination, access component data relating to characteristics of components of the electric power grid involved in provision and/or consumption of electric power; and based on received measurement data relating to the change and the accessed component data, determine a power flow characteristic of the grid in a given time period, the power flow characteristic relating to an amount of power flow to and/or from at least one of the components.

Further features and advantages of the invention will become apparent from the following description of preferred embodiments of the invention, given by way of example only, which is made with reference to the accompanying drawings.

DETAILED DESCRIPTION OF CERTAIN INVENTIVE EMBODIMENTS

Figure 1:
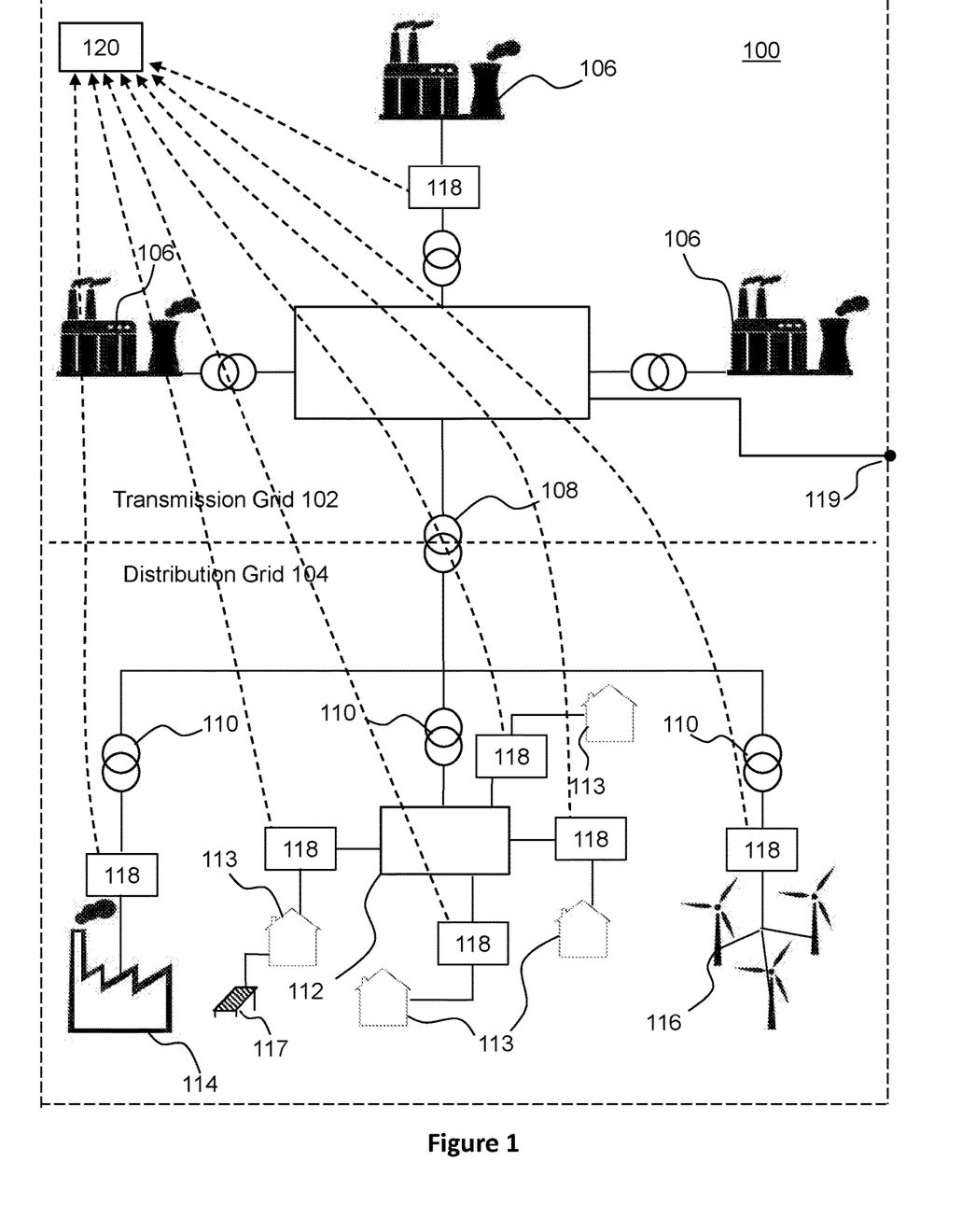
FIG. 1 is a schematic diagram illustrating an electric power grid in which the invention may be implemented.

Supply of electricity from providers such as power stations, to consumers, such as domestic households and businesses, typically takes place via an electric power grid. FIG. 1 shows an exemplary electric power grid 100, in which embodiments of the present invention may be implemented, comprising a transmission grid 102 and a distribution grid 104.

The transmission grid 102 is connected to power generators 106, which may be nuclear plants or gas-fired plants, for example, from which it transmits large quantities of electrical energy at very high voltages (typically of the order of hundreds of kV), over power lines such as overhead power lines, to the distribution grid 104.

The transmission grid 102 is linked to the distribution grid 104 via a transformer 108, which converts the electric supply to a lower voltage (typically of the order of 50 kV) for distribution in the distribution grid 104.

The distribution grid 104 is connected, via substations 110 comprising further transformers for converting to still lower voltages, to local networks which provide electric power to power consuming devices connected to the electric power grid 100. The local networks may include networks of domestic consumers, such as a city network 112, that supplies power to domestic appliances within private residences 113 that draw a relatively small amount of power in the order of a few kW. Private residences 113 may also use photovoltaic devices 117 to provide relatively small amounts of power for consumption either by appliances at the residence or for provision of power to the electric power grid 100. The local networks may also include industrial premises such as a factory 114, in which larger appliances operating in the industrial premises draw larger amounts of power in the order of several kW to MW. The local networks may also include networks of smaller power generators such as wind farms 116 that provide power to the electric power grid 100.

Although, for conciseness, only one transmission grid 102 and one distribution grid 104 are shown in FIG. 1, in practice a typical transmission grid 102 supplies power to multiple distribution grids 104 and one transmission grid 102 may also be interconnected to one or more other transmission grids 102.

Electric power flows in the electric power grid 100 as alternating current (AC), which flows at a system frequency, which may be referred to as a grid frequency (typically 50 or 60 Hz, depending on the country). The electric power grid 100 operates at a synchronized frequency so that the frequency is substantially the same at each point of the grid.

The electric power grid 100 may include one or more direct current (DC) interconnects 119 that provide a DC connection between the electric power grid 100 and other electric power grids. Typically, the DC interconnects 119 connect to the high voltage transmission grid 102 of the electric power grid 100. The DC interconnects 119 provide a DC link between the various electric power grids, such that the electric power grid 100 defines an area which operates at a given, synchronised, grid frequency that is not affected by changes in the grid frequency of other electric power grids. For example, the UK transmission grid is connected to the Synchronous Grid of Continental Europe via DC interconnects.

Herein, the term "grid component" is used to refer to a component of the electric power grid 100 involved in the provision and/or consumption of electric power, such as the power generators, power consumers and devices involved in the transmission and/or distribution of power such as the interconnects referred to above, transformers and the like.

In embodiments, the electric power grid 100 also includes measurement units 118 arranged to measure at least one characteristic of the electric power at respective measurement locations of the electric power grid. The measurement units 118 may be located in the distribution grid 104 or in the transmission grid 102, or at any other location of the electric power grid 100. Although, for the sake of simplicity, only seven measurement units 118 are shown in FIG. 1, it will be understood that, in practice, the electric power grid 100 may comprise hundreds or thousands of such devices.

For example, the measurement units 118 may be arranged to measure one or more of: frequency, inertia, voltage, reactive power and current (and/or derivatives thereof) of the electric power flowing in the electric power grid 100. The measurement units 118 each include a communications interface for communicating with a monitoring system (described below), via which measurement data may be sent. The measurement units 118 may also include data stores for recording and storing measurement data.

In embodiments, a monitoring system 120 may monitor the measured at least one characteristic based on measurement data received from one or more of the measurement units 118. The monitoring system 120 may be located within the geographical area of the electric power grid 100 as shown in FIG. 1, or may be located outside the geographical area of the electric power grid 100.

Figure 2:
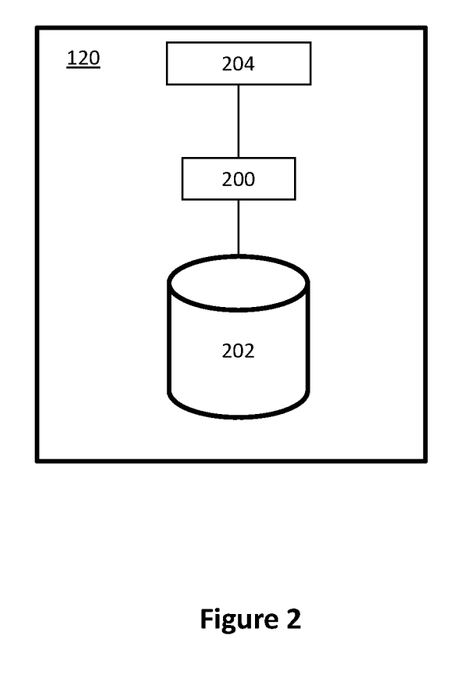
FIG. 2 is a schematic diagram of a monitoring system according to an example.

The monitoring system 120 may comprise, for example, a computing device. FIG. 2 shows an example monitoring system 120 arranged to determine a power flow characteristic of the electric power grid in a given time period. The monitoring system 120 comprises a processor 200, a data store 202 and a communications interface 204. The processor 200 may comprise one or more processing units, such as one or more central processing units (CPUs). The data store 202 may, for example, be a non-transitory computer readable storage medium such as a Read Only Memory (ROM) and/or Random Access Memory (RAM), a hard disk drive, solid state drive, or flash memory or the like. In some embodiments, the data store 202 holds component data relating to characteristics of grid components of the electric power grid involved in provision and/or consumption of electric power in the electric power grid 100. The communications interface 204 may enable communication with the measurement units. Communication between the monitoring system 120 and the measurement units 118 may comprise wired and/or wireless communication.

The data store 202 may store computer software executable by the processor 200 to perform any of the methods described herein.

Figure 3:
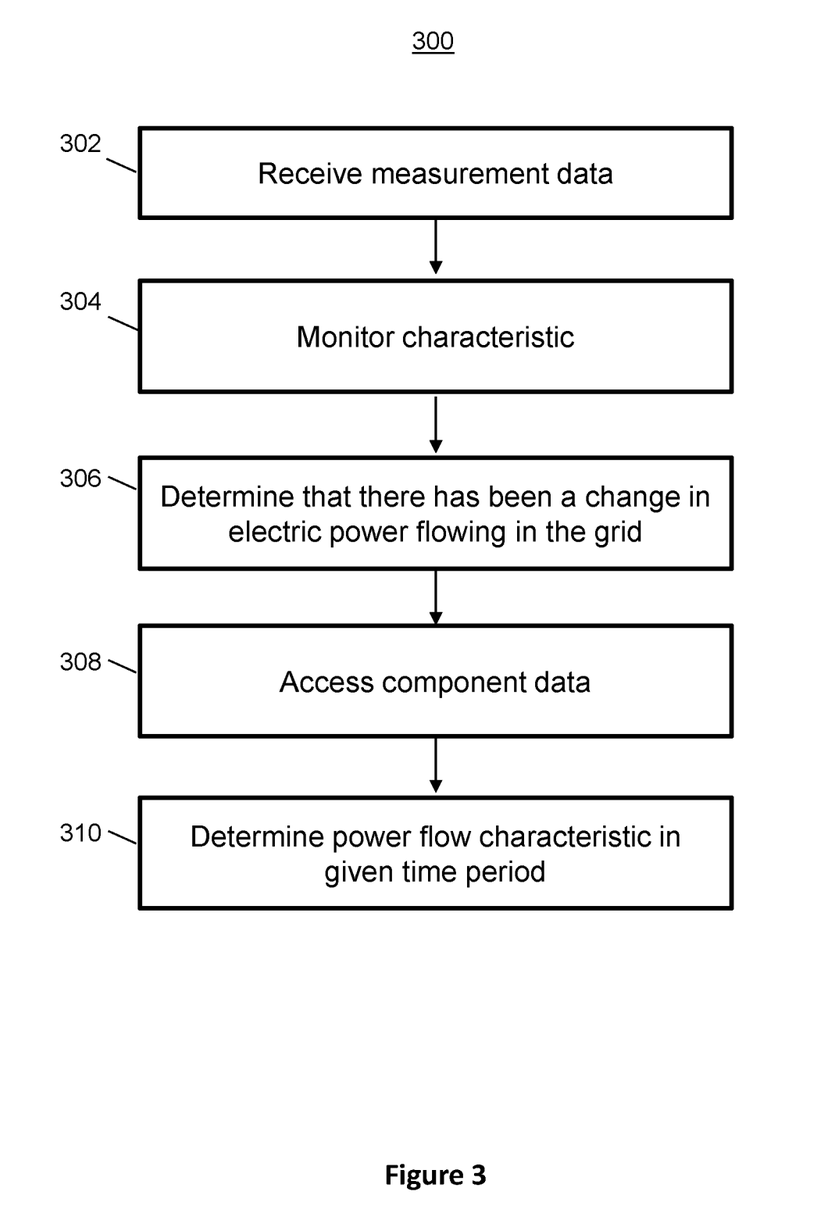
FIG. 3 is a flow diagram showing a first method according to an example.

FIG. 3 is a flow diagram showing a method 300 which may be performed by the monitoring system 120 according to an embodiment.

At block 302, the monitoring system 120 receives measurement data from the measurement units 118. The measured data may be received continuously or intermittently via the communications interface 204, for example.

At block 304, the monitoring system 120 monitors at least one characteristic of the electric power at the respective measurement locations of the measurement units 118.

At block 306, the monitoring system 120 determines that there has been a change in electric power flow in the electric power grid, based on the monitoring. For example, the monitoring system 120 may determine that there has been a change in the monitored characteristic at one or more of the measurement locations, and on that basis determine that there has been a change. The determination may be made for example based on a sudden change in a monitored value of the monitored characteristic, or a value of the monitored characteristic moving past a threshold value. The change may have resulted from, for example, an event such as a power provision component such as a power station or a power consumption component, such as a factory, having become disconnected from the grid, or an interconnect with another grid having "tripped" (i.e. ceased to transmit power), or for another reason.

At block 308, the monitoring system 120 accesses component data relating to characteristics of components of the electric power grid involved in provision and/or consumption of electric power. The component data may be stored in the data store 202, or may be stored remotely, in a server for example, and accessed by the monitoring system 120 via the communications interface 204.

Figure 4A:
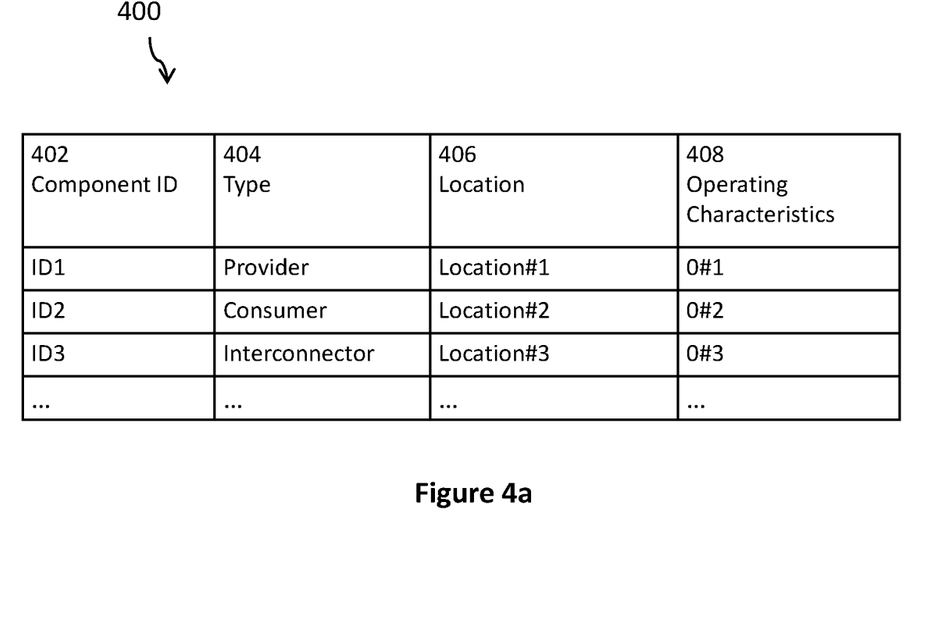
FIG. 4a is a schematic diagram illustrating a component database for use in an example.

FIG. 4 illustrates an example of component data in the form of a component database 400. In this example, the component database 400 includes a plurality of entries for each grid component, including a component ID entry 402, a component type entry 404, a location entry 406 and an operating characteristics entry 408. Other examples may include fewer or more entries. The component type entry 404 may indicate, for example, whether the corresponding grid component is a provider or a consumer of electric power (or both), or whether the grid component is an interconnect 119, providing a connection to another electric power grid. The location entry 406 may provide an indication of a location of the corresponding grid component. The location may be a grid location of the grid component within the electric power grid 100, or it may be a geographical location.

The operating characteristics entry 408 may indicate an amount of electric power that the corresponding grid component provides or consumes. For example, an average amount of consumption/provision may be indicated. In some cases, the amount of electric power consumption/provision may vary significant with time, for example if the grid component is an interconnect used to transfer varying amounts of power to/from other electric power grids, a renewable energy supplier or a power consumer with variable consumption requirements. In this case, the corresponding power amount may not be provided, or the entry may be dynamically updated with real time or near real time data. The real time or near real time data may be based on, for example, local measurements and/or data supplied by an administrator of the grid component or by a system operator for example. The operating characteristics entry 408 may additionally or alternatively indicate other data, such as a "settlement period" i.e. a typical time frame for restarting the grid component in the event of a failure and/or an inertial value associated with the grid component.

At block 310, the monitoring system 120 determines a power flow characteristic in a given time period, based on received measurement data relating to the change and the accessed component data. The determination may comprise a prediction of a power flow characteristic in a current or future time period, for example. The power flow characteristic may relate to an amount of power flow to and/or from at least one of the grid components. For example, it may be determined based on the monitored characteristics and the component data that a power provision component has ceased supplying power to the electric power grid 100. The size of the change may be determined based on measured data relating to the change and/or the accessed component data. Based on the determined change and size thereof, a power flow characteristic for a given time period may be determined or estimated. For example, it may be determined there will be a shortfall in an amount of electric power supply to the power grid for a given period e.g. 1 hour after the detected change.

Figure 4B:
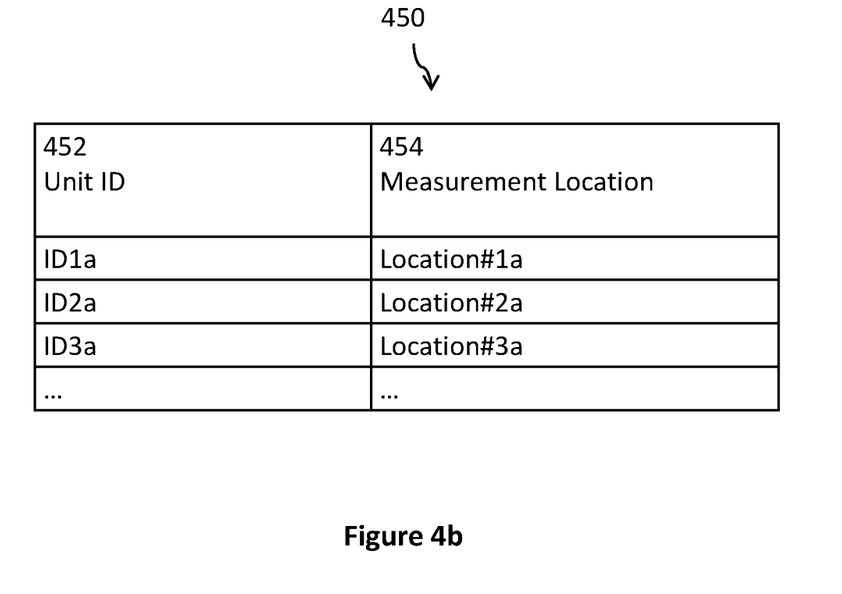
FIG. 4b is a schematic diagram illustrating a location database for use in an example.

In some embodiments, a location of a source of the change is determined and the determination of the power flow characteristic is performed based on the determined location. In this case, the monitoring system 120 may have access to location data indicating measurement locations of the respective measurement units 118. As with the component data 400 described above, the location data may be stored in the data store 202 or may be stored remotely, for example in a server. FIG. 4b shows an example of the location data in the form of a location database 450, including a unit ID entry 452 and a measurement location entry 454 for each measurement unit 118.

Figure 5:
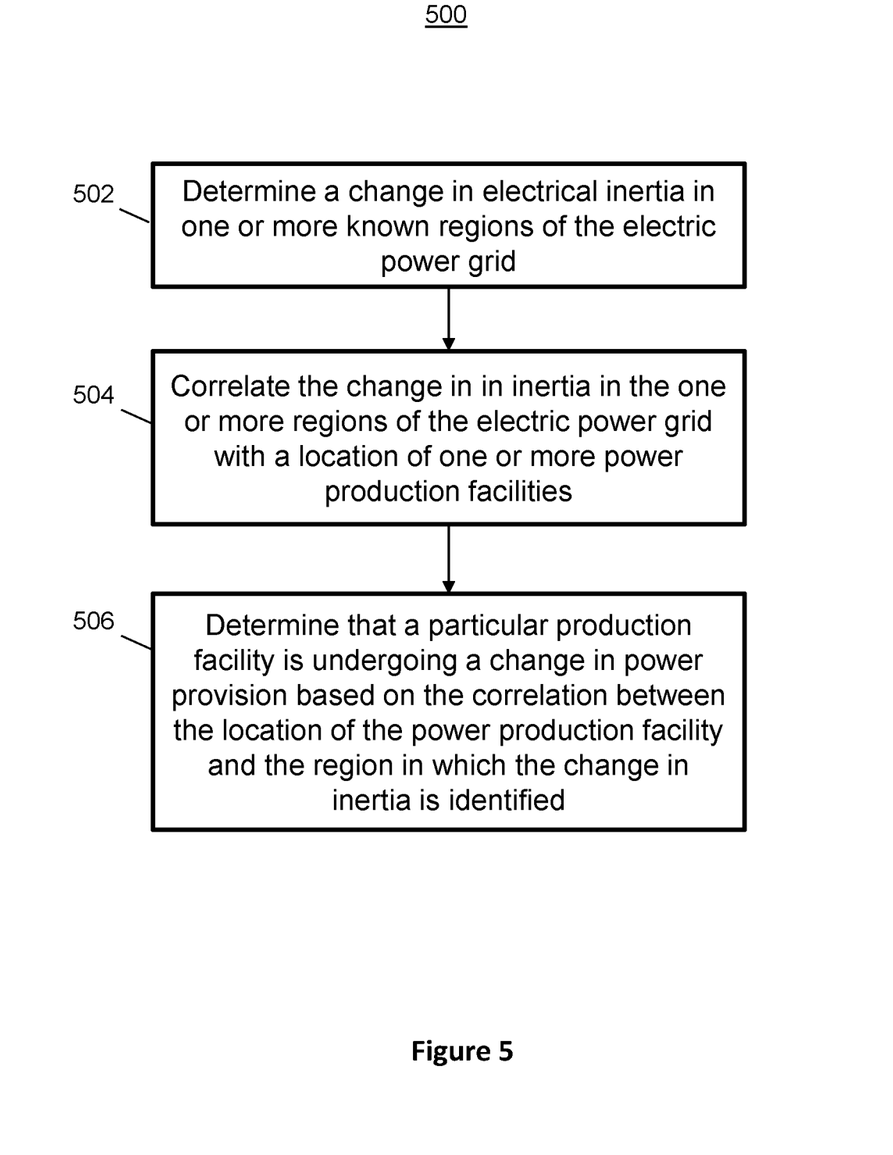
FIG. 5 is a flow diagram showing a second method according to an example.

FIG. 5 is a flow diagram illustrating an example method 500 by which the monitoring system 120 may use the location of electric grid components to predict a power flow characteristic in the electric power grid 100. In the example of FIG. 5, the monitored characteristic is inertia.

At block 502, a change in inertia in one or more known regions of the electric power grid 100 is determined. For example, the monitoring system 120 may determine a change in inertia in a particular region of the electric power grid 100 on the basis of location data in the location database 450 identifying the location of a measurement unit 118. The measurement units 118 may transmit measurement data with the measurement unit ID 452 in order to facilitate the determination of the location, for example.

At block 504, a location of one or more grid components may be correlated with the change in in inertia in the one or more regions of the electric power grid 100. For example, based on the location entries 406 in the component database 400, the monitoring system 120 may determine that a particular grid component (or group of grid components) is located in a particular region.

At block 506, based on the correlation between the location of the power production facility and the region in which the change in inertia is identified, a determination that a particular grid component is a source of the change in inertia is made. For example, the monitoring system 120 may correlate the change in inertia with a known inertia due to a grid component such as a production facility located in the region in which the change in inertia is detected, based on known operating characteristics of the production facilities in that region, as determined based on the component database 400 for example.

In some examples, the monitoring system 120 may utilise location data in the location entry 406 specifying the locations of production facilities in the same region and/or data specifying the operating characteristics of those production facilities, and may thereby determine a grid component in the region which may be responsible for the determined change in inertia. In this way, it is possible to identify a particular grid component as being the source of the change in the monitored characteristic.

In some examples, a location of the source of the change is determined based on times of detection of the change at different ones of the measurement units 118. When an event occurs in an electric power grid 100 such as the disconnection of an interconnect 119 with another grid, a sudden stop of a power station 106 for example, the resultant change in electric power propagates through part or all of the electric power grid 100. By correlating the times of detection at different measurement units 118 and the respective locations of the measurement units 118, a location of an event may be determined.

Figure 6:
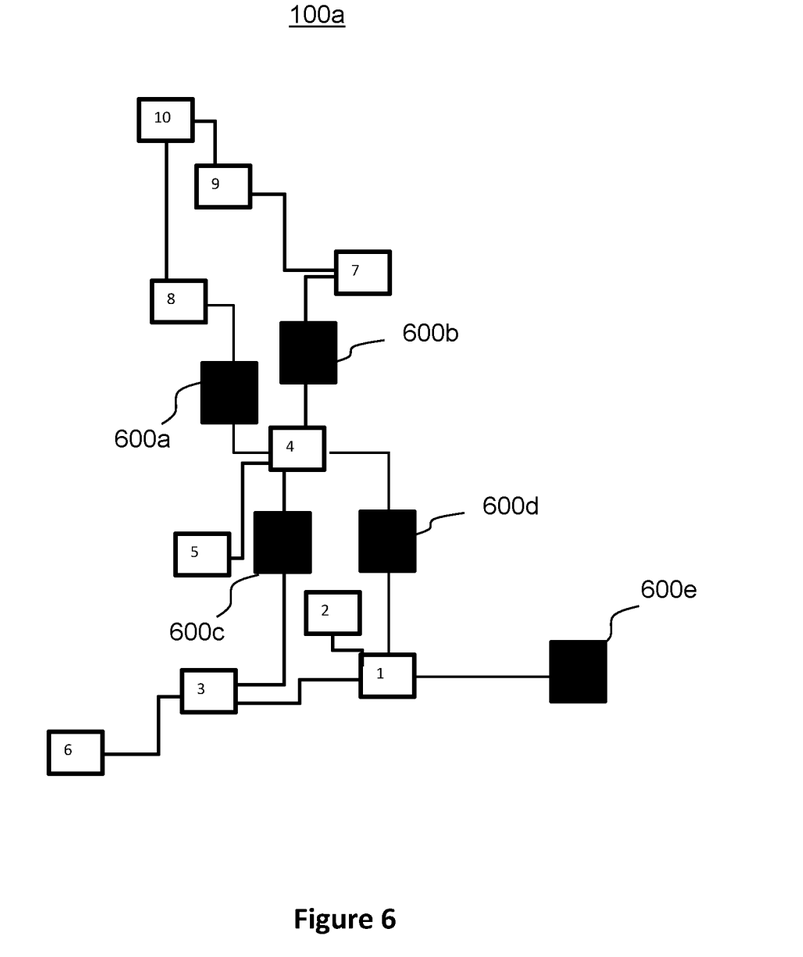
FIG. 6 is a simplified schematic diagram illustrating an electric power grid in which the invention may be implemented.

A further example is now described with reference to FIG. 6. FIG. 6 is simplified schematic drawing of an electric power grid 100*a*, grid components 600*a* to 600*e* and ten measurement units labelled 1 to 10.

We assume that grid component 600*e* is an interconnect with another grid, and further assume that the interconnect 600*e* "trips" i.e. ceases to transit power between the grids. The trip causes a change in an electric power flow characteristic (in this example, we shall refer to frequency) to propagate through the electric power grid 100*a*.

In this case, the order of detection of the change due to the interconnect 600*e* tripping at the measurement units may be detected in the order 1, 2, 3, 4, 5, 6 (we ignore any detection at the remainder of the measurement units for the purpose of this example). Based on the difference between the times of detection, and a known propagation speed of the change, a location of the source of the event may be determined, based on a map of the electric power grid 100*a*, and using a triangulation technique, for example.

The propagation speed may vary according to factors such as event magnitude, number of electric lines and their impedances and local inertia values for example. For present purposes, a value estimated based on observed previous events may be used, for example.

As mentioned, the location obtained for the source of the event may be a grid location. The determination of the location (using e.g. a triangulation technique, as mentioned) may be based on "logical distances" within the electric power grid 100*a*. The logical distances may comprise for example distances as measured along power lines (as opposed to geographical distances). In some examples, the logical distance takes account of different conditions within a grid e.g. maximum power flow, the presence of transformers and other components etc. and/or a direction of power flow, which may affect the speed of propagation of the event. Additionally or alternatively, the logical distance may take account of whether the change may have propagated to a particular measurement unit via multiple routes.

In some embodiments, more than one measurement unit may be located on a power line to which at least one of the grid components is located. This may enable, for example, a direction of propagation to be determined thereby assisting in the location determination.

The determination of the location may involve multiple steps. For example, an initial estimate may be made based on the measurement unit which first detects the event (in the above example, this would be measurement unit 1 for example). The logical distance from measurement unit 1 to the other measurement units which have detected the change may then be calculated.

Figure 7A:
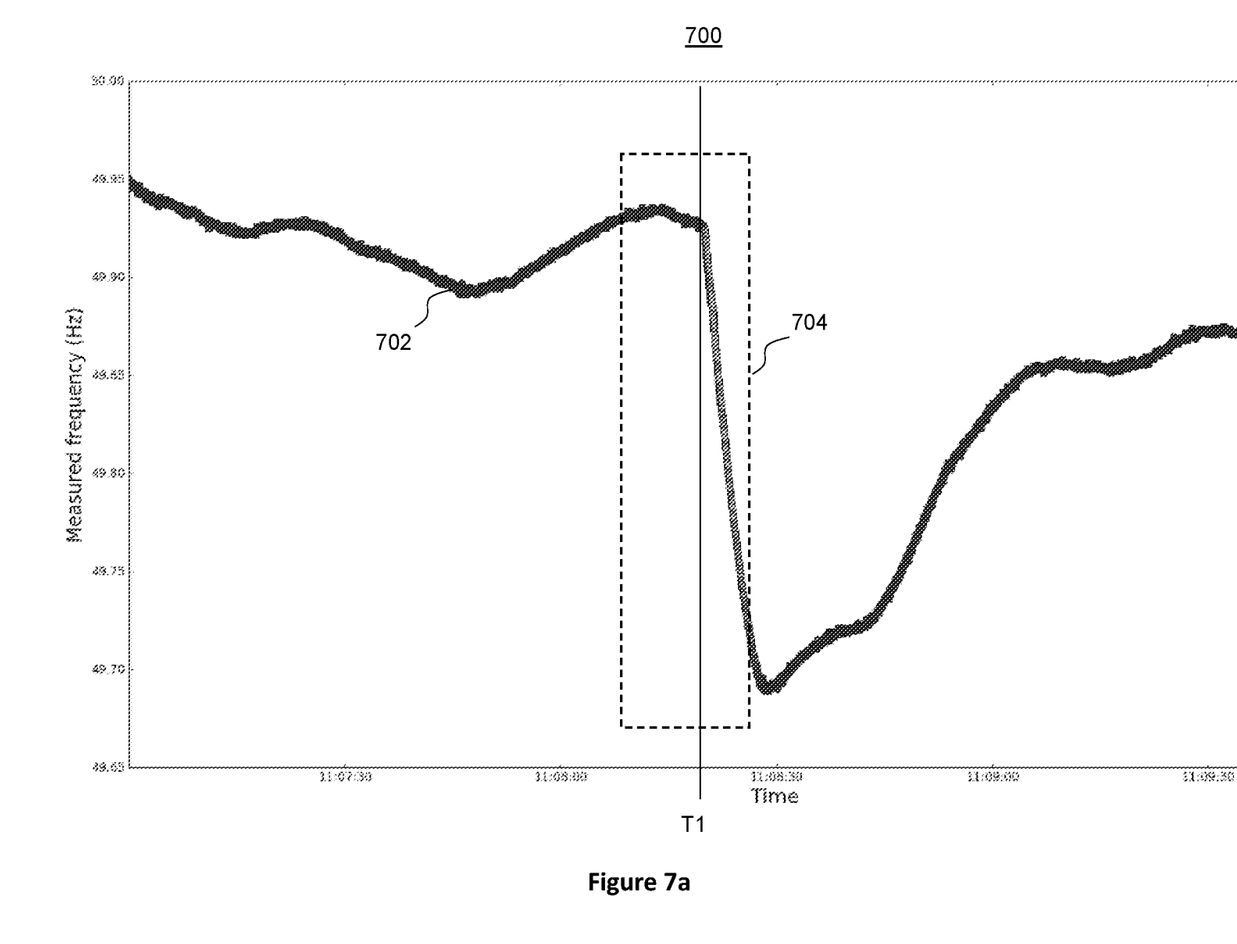
FIG. 7a is a first graph of a monitored frequency against time.
Figure 7B:
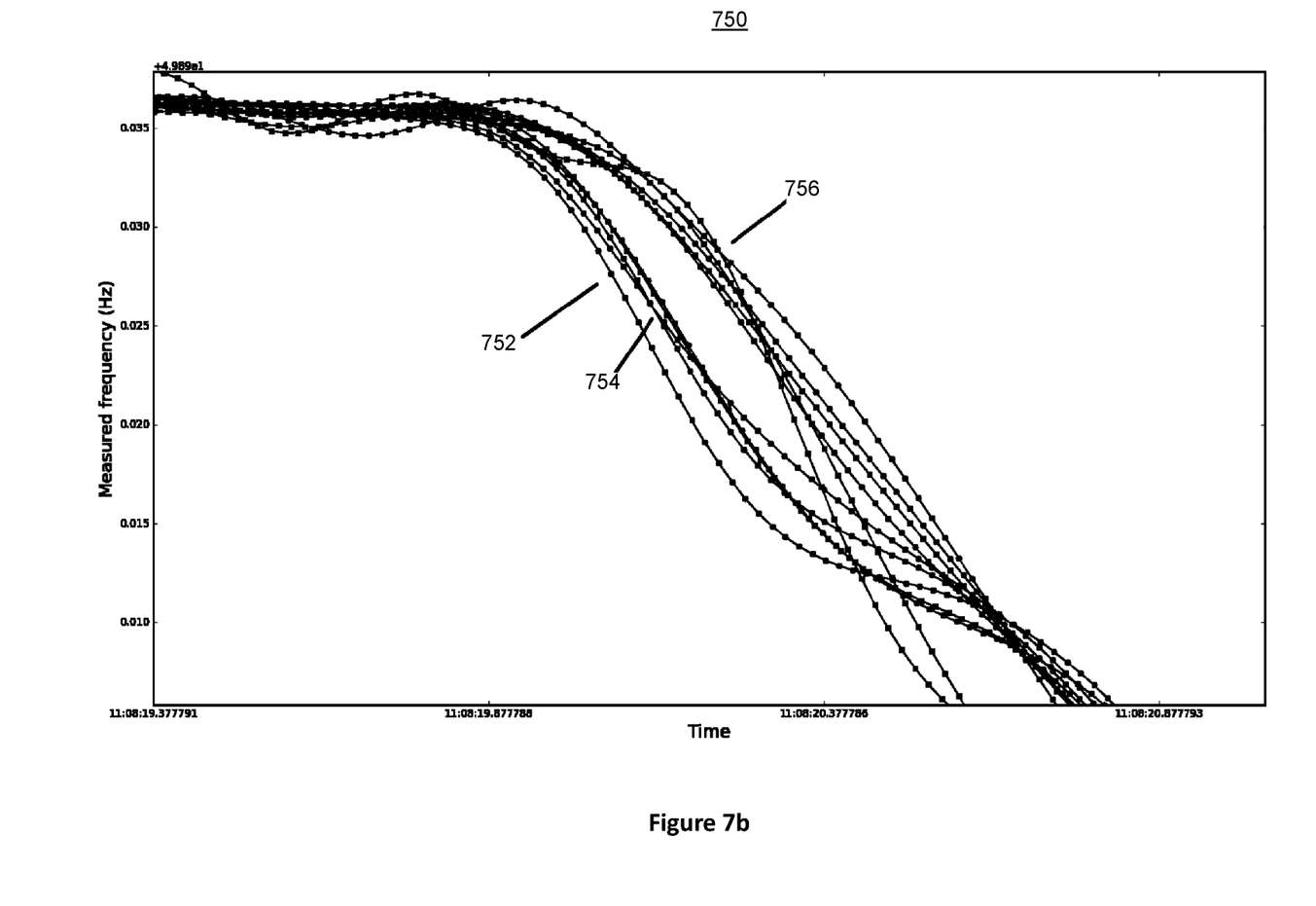
FIG. 7b is a second graph of a monitored frequency against time.

In some embodiments, the monitoring system 100 may first detect that an event has occurred, and responsive to the detection perform a further analysis process to determine the source of the event (i.e. the source of a detected change in the electric power characteristic). FIGS. 7*a* and 7*b* illustrate an example, in which the characteristic monitored by the monitoring system 120 is frequency. In this example, the monitoring is based on measurements from eleven monitoring units 118. In the graph 700 shown in FIG. 7*a*, the frequency and time scales are such that the monitored frequency appears as a single line 702. The monitoring system 120 may thus monitor an aggregate of the frequency measurements from the different measurement units 118.

As illustrated in FIG. 7*a*, at approximately time T1, a change in the monitored frequency at around T1 occurs, which may be detected by the monitoring system 120. The change may be detected based on, for example a determination that the frequency has moved outside a predetermined range or has crossed a threshold value. Additionally or alternatively, the rate of change of frequency (RoCoF) may be monitored and the detection may be based on a change therein for example.

In response to detecting the change, the monitoring system 120 performs more detailed analysis on the measurement data received from the measurement units 118 at a time period around the time T1 of the detected change. FIG. 7*b* is a "zoomed-in" graph 750 of the area 704 of the graph 700 of FIG. 7*a*. At the scales of frequency and time used in graph 750, the measurements from individual measurement units 118 are discernible. For example, it can be seen that the monitoring units corresponding to lines 752 and 754 have detected the change earlier than the monitoring unit corresponding to the lines indicated by 756 (i.e. the change in frequency has propagated to the former earlier than to the latter).

Based on analysing the data illustrated by FIG. 7*b*, the order at which the change propagates to the different measurement units 118 may be determined. One or more time difference between the times at which the change propagates to the different measurement units 118 may be calculated. For example, the time differences may be calculated from the times when measured frequencies at different units cross a pre-determined threshold value. A location of the source of the change may then be determined, as described above.

The method of determining the location of the source of the change set out above in relation to FIGS. 7*a* and 7*b* enables changes to be monitored and analysed efficiently, saving the monitoring system 120 from using processing resources in continuous detailed analysis of data from the measurement units 118 for example. In some embodiments, the measurement units 118 may provide first data by default to enable the monitoring system 120 to monitor for a change, and then be triggered (for example, by a signal from the monitoring system 120) to provide second data, more detailed than the first data, to the monitoring system 120 in order to enable more detailed analysis (as described in relation to FIG. 7*b*, for example). For example, the measuring units 118 may take and record measurements periodically, according to a first period, but only send particular ones of the measurements (for example, every third, every tenth etc) of the measurements to the monitoring system 120 by default. On receipt of a signal from the monitoring system 120, some or all of the previously unsent data for a period specified (in the signal from the monitoring system 120 for example) may be sent to the monitoring system 120, to enable the latter to perform more detailed analysis of the period in question.

In some examples, the determination of a location of the source of the change may be probabilistic. For example, the based on the detection times of each of the measurement units, a calculation of the probability of each measurement unit being the closest one to the source of the change may be calculated.

In some examples, the determination of the location may be sufficient to enable the source of the change to be identified. In some examples, however, further data may be used to determine the source of the change. For example, a measure of the magnitude of the event (e.g. a magnitude of a change in power flow (referred to herein as a "power imbalance")) may be determined, and this compared with data included in the operating characteristics entry 408 of components database 400. In one example, the location determination as described above may be used to determine an area (logical grid area or geographical area) in which the source of the change is located. Based on data in the location field 406 of the components database 400 a plurality of candidates for the source of the change may be identified (i.e. those grid components determined as being located within the determined area). Other characteristics of the detected change, determined based on analysis of data as described above in relation to FIGS. 7a and 7b for example may then be compared with data in the operating characteristics entry 408 to determine which of the candidate components may be the source of the change. For example, if is determined that the change is (or is likely) due to a sudden drop in power provision to the grid of greater 10 MW within a certain region and, based on data in the location entries 406 and operating characteristic entries 408, there is only one grid component within the determined area that could have caused such a drop in power provision, then this grid component is identified as the source of the change. In some examples, this identification is based on a time at which the change is detected. For example, the operating characteristics field 408 may include information regarding operating schedules of components of the electric power grid 100. For example, if the operating characteristics data of an interconnect indicate that it will be importing power from another power grid during a certain period of the day, then it may be a candidate of a source of the change during this period, but not during other periods.

Additionally or alternatively, one or more characteristics of the change may be analysed based on the received data to determine a characteristic of the source of an event. For example, certain types of electricity generators, such as nuclear energy generators may reduce power generation relatively slowly after a failure event. If a measured RoCoF remains below a certain threshold value for a certain period of time, this may indicate that a power generator of this type is the source of the change. Conversely, a sudden change in frequency (RoCoF relatively stable) may indicate a sudden reduction or increase in power provision or consumption, indicating a failure event in a component which changes its power provision and/or consumption relatively suddenly. In another example, a failure of a transmission component, such as a transformer, may result in a re-routing of a power supply or consumption, which could be detected due to a change in phase.

The determination of the magnitude of the change in power flow mentioned above may be on the basis of an inertia value relating to power flow in the electric power grid 100 (a system inertia). The inertia may be determined using a technique as set out in the Applicant's co-pending patent application published with publication number GB2515358, for example. Once the system inertia is known, the magnitude of the power imbalance may be calculated using the following equation:

$$\frac{2H}{f_0} \cdot RoCoF = \Delta P, \qquad \text{(Equation 1)}$$

where H is the system inertia, $f_0$ is the nominal frequency (e.g. 50 Hz in the UK), RoCoF is the rate of change of frequency as measured as described above in relation to FIGS. 7a and 7b and $\Delta P$ is the power imbalance.

Other methods of calculating the power imbalance may be used. For example a detailed grid model featuring electric power transmission locations, local inertia values, frequency response from power stations and/or multiple RoCoF values from different locations may be used in place of the equation 1. Additionally or alternatively, a regression and/or machine learning model could be used calibrated on previous observations of system disturbances and their causes.

In some embodiments, once the power imbalance, or other amount of power flow, has been determined, action may be taken to compensate for same. For example, if a shortfall in electric power provision (or, equivalently, an excess in electric power consumption) is determined based on the above processes, action may be taken to increase power provision and/or decrease power consumption. For example, action may be taken via an interconnect 119 to import power from another electric power grid, and/or power consumers may be disconnected from the electric power grid 100. Conversely, if an excess in electric power provision (or, equivalently, a shortfall in electric power consumption) is determined based on the above processes, action may be taken to decrease power provision and/or increase power consumption. For example, a power source such as a power station 106 may be disconnected from the grid and/or one or more power consumers may be connected. For example, a scheduled action requiring power consumption may be brought forward. This may be done, via a scheme according to which power consumers are requested to increase power consumption during periods when there is excess power capacity available, for example. The shortfall/excess mentioned above may be a shortfall or excess in relation to the whole electric power grid 100, or to only part of it. The latter may occur for example in cases where a fault or failure occurs in a transformer or other element involved in the transmission of power between parts of the electric power grid 100.

In order to determine the requirements for this compensatory action, it may be useful to determine the total amount of electrical energy (referred to herein as the Net Imbalance Volume (NIV)) that the detected change represents. The NIV may be calculated according to the following equation:

$$\Delta NIV = \Delta P \cdot t_{SP} \qquad \text{(Equation 2),}$$

where $\Delta P$ is the power imbalance, which may be calculated according to equation 1 above for example, and $t_{sp}$ is a length of a settlement period as described above (i.e. a typical time for the component that this the source of the change to resume its expected operation (e.g. to provide or consume electric energy at an expected rate, such as the rate prior to the change). As mentioned above, the settlement period may be determined based on data in the operating characteristics entry 408 of the components database 400, for example. In some cases, the grid component may resume consumption/provision of electrical power gradually or in stages during the settlement period, in which case $\Delta P$ is a function of time, and equation 2 is modified accordingly.

The compensatory action referred to above may be taken by the system operator, or by another party. In some cases, different parties may operate substantially independently of one another, and it may be advantageous for a particular party to take account of the actions of other parties in determining any compensatory action to take.

Figure 8:
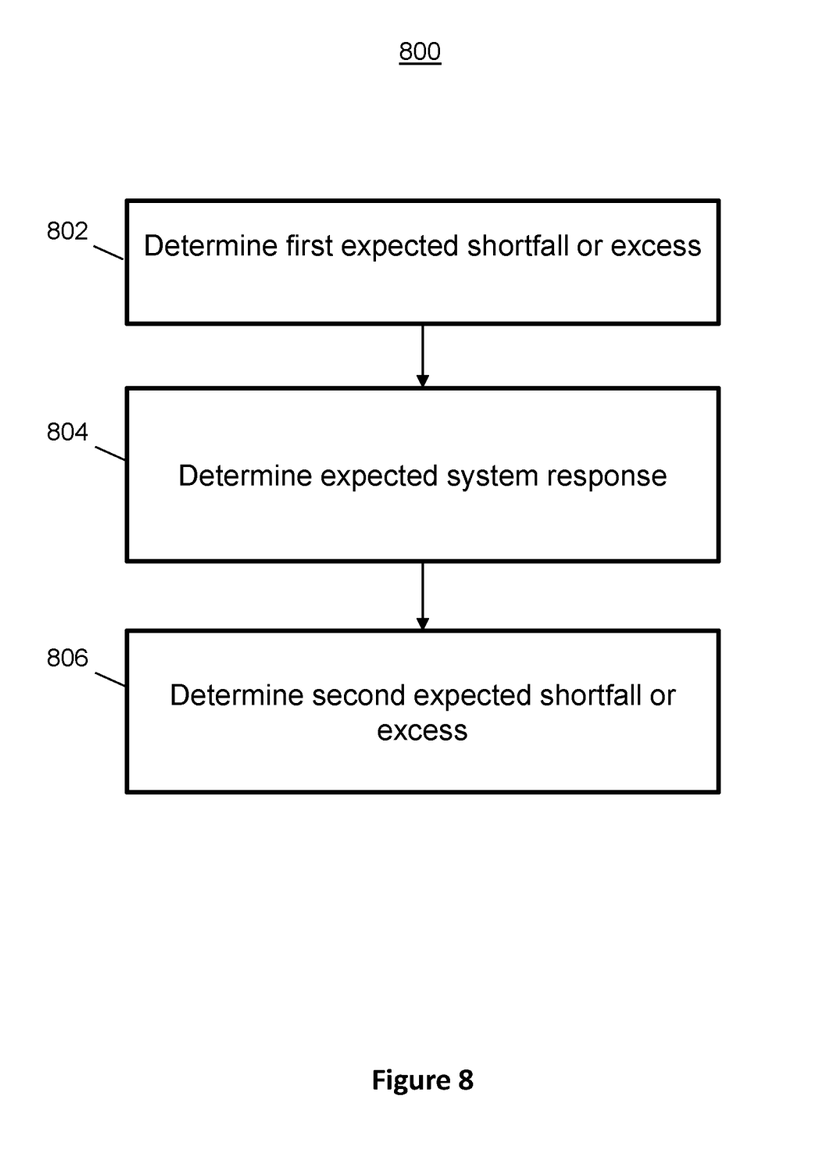
FIG. 8 is a flow diagram showing a third method according to an example.

FIG. 8 is a flow chart showing a method 800 according to an embodiment. At block 802 the monitoring system 120 determines a first expected shortfall or excess in power provision to the electric power grid 100 during a given time period. For example, the expected shortfall or excess may be the power imbalance mentioned above and the given time period may be the settlement period, or another time period.

At block 804, the monitoring system 120 determines an expected system response to compensate for the expected shortfall. The system response referred to here is a measure of expected compensatory action that may be performed to compensate for the change in power flow characteristics. This system response may be determined based on, for example, data relating to similar past events and the responses that occurred in response to same and/or data (such as market data) relating to capacity for provision or consumption of electric power, for example.

At block 806, the monitoring system 120 determines a second expected shortfall or excess in power provision to the electric power grid 100 during the given time period, based on the expected system response determined at block 804. For example, a magnitude of the expected system response may be subtracted from the first expected shortfall or excess to provide the second expected shortfall or excess.

A value of the second expected shortfall or excess may then form the basis of compensatory action performed by the entity provided with this data (for example, an administrator responsible for assigning energy provision and/or consumption) of grid components of the electric power grid, for example. In other words the expected actions of other parties may be taken into account and e.g. energy provision adjusted accordingly.

While in the example of method 800, the expected system response was used as the basis for determining the second expected shortfall or excess, other data pertinent to power consumption and/or provision may additionally or alternatively be taken into account. Examples of this other data include, pricing/cost data and schedules of events that may have an effect on energy consumption, data relating to public events, such as national holidays, sporting events and concerts, and travel schedules such as train timetables, which may indicate times when an increase in inertia-contributing load may be expected.

The above methods provide a convenient way to determine power flow characteristics of an electric power grid. This may enable compensatory action to be taken, for example, as set out above.

The above embodiments are to be understood as illustrative examples of the invention. Other embodiments are envisaged. For example, while some of the above examples, specific measured characteristics such as inertia and frequency were referred to, other characteristics may be used in place of those referred to. For example, voltage and/or phase may be used, together with data relating to power line impedance, for example.

While in some of the embodiments described above, a location of the source of an event is identified, in some embodiments this may not be necessary. For example, in some cases it may be possible to determine the source of an event based only on a change in inertia or other characteristic of the electric power flow, or other analysis as described above. In some embodiments, high precision frequency or other characteristic data may enable the power imbalance to be determined, without determining a specific location.

While in the above examples, reference was made to determination of a power imbalance or other electric power flow characteristic during a future time period, in some examples the determination may be made for a past time period. This may be useful, for example, in building grid models as described above. For example, recurring events may be screened for and analysed in this way.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A method for use in an electric power grid, electric power flowing in the electric power grid, the method comprising:
    receiving measurement data intermittently or continuously from a plurality of measurement units, the measurement units being arranged to measure at least one characteristic of the electric power at respective measurement locations in the electric power grid, the measurement data indicating values of the at least one measured characteristic at the respective measurement locations;
    monitoring the at least one characteristic at the plurality of measurement locations based on the received data, the monitored at least one characteristic comprising an inertia characteristic;
    determining, based on the monitoring, that there has been a change in electric power flow in the electric power grid;
    responsive to the determination, accessing component data relating to characteristics of a plurality of components of the electric power grid, each of the plurality of components comprising a device or a plurality of devices configured to provide electric power to and/or consume electric power from the electric power grid, and the component data comprising data relating to inertia values associated with respective components;
    identifying a first component of the plurality of components as a source of the change at least partly on the basis of the monitored inertia characteristic and the inertia values; and
    based on received measurement data relating to the change, the accessed component data and the identification, determining a power flow characteristic of the grid in a given time period, the power flow characteristic relating to an amount of power flow to and/or from at least one of the components.

2. A method according to claim 1, comprising determining a first expected shortfall or excess in electric power provision to at least part of the electric power grid in the given time period based on the determined power flow characteristic.

3. A method according to claim 2, comprising determining a second expected shortfall or excess based on an expected system response to compensate for the first expected shortfall or excess.

4. A method according to claim 1, wherein the component data includes location data relating to locations of the components, and the first component is identified based on the location data and the measurement locations.

5. The method according to claim 4, wherein method comprises determining a location of a source of the change in the electric power grid based on times at which the change propagates to different ones of the measurement units.

6. A method according to claim 1, wherein the component data includes power flow data relating to a magnitude of power flow to and/or from the components, and the first component is identified based on the power flow data.

7. A method according to claim 6, wherein the monitored at least one characteristic comprises a frequency characteristic of the electric power flow in the electric power grid, and the method comprises:
   determining a magnitude of a change in power flow due to the determined change, based on the determined change in the frequency characteristic and an inertia value relating to power flow in the electric power grid; and
   identifying the first component based on the determined magnitude.

8. A method according to claim 1, comprising performing an analysis process to identify the first component of the plurality of components as a source of the change, the analysis process comprising an analysis of the received measurement data relating to the change, the analysis process being performed in response to the determination that there has been a change in electric power flowing in the electric power grid.

9. A method according to claim 8, wherein the received measurement data relating to the change is of a higher temporal resolution than the data on which the monitoring is performed.

10. A method according to claim 1, comprising:
    analysing one or more characteristics of the change based on the received data to determine a characteristic of the source of the event; and
    identifying the first component at least partly on the basis of the analysis.

11. A non-transitory computer readable storage medium, storing instructions, that when executed by a processor, cause the processor to perform a method according to claim 1.

12. A monitoring system for use in an electric power grid, electric power flowing in the electric power grid, the monitoring system comprising a communications interface and a processor, wherein:
    the communications interface is arranged to receive measurement data intermittently or continuously from a plurality of measurement units, the measurement units being arranged to measure at least one characteristic of the electric power at respective measurement locations in the electric power grid, the measurement data indicating values of the at least one measured characteristic at the respective measurement locations; and
    the processor is arranged to:
        monitor the at least one characteristic at the plurality of measurement locations based on the received data, the monitored at least one characteristic comprising an inertia characteristic;
        determine, based on the monitoring, that there has been a change in electric power flow in the electric power grid;
        responsive to the determination, access component data relating to characteristics of a plurality of components of the electric power grid, each of the plurality of components comprising a device or a plurality of devices configured to provide electric power to and/or consume electric power from the electric power grid, and the component data comprising data relating to inertia values associated with respective components;
        identify a first component of the plurality of components as a source of the change at least partly on the basis of the monitored inertia characteristic and the inertia values; and
        based on received measurement data relating to the change, the accessed component data and the identification, determine a power flow characteristic of the grid in a given time period, the power flow characteristic relating to an amount of power flow to and/or from at least one of the components.

13. A monitoring system according to claim 12, comprising the plurality of measurement units.

14. A monitoring system according to claim 13, wherein at least two of the measurement units are arranged to measure the at least one characteristic at different respective locations on a power line to which one of the components of the electric power grid is connected.

* * * * *